United States Patent [19]
Camparo

[11] Patent Number: 6,025,755
[45] Date of Patent: Feb. 15, 2000

[54] METHOD OF STABILIZING ELECTROMAGNETIC FIELD STRENGTH IN AN ATOMIC SYSTEM

[75] Inventor: James C. Camparo, Redondo Beach, Calif.

[73] Assignee: The Aerospace Corporation, El Segundo, Calif.

[21] Appl. No.: 08/989,799

[22] Filed: Dec. 12, 1997

[51] Int. Cl.[7] .................................................. H03L 7/26
[52] U.S. Cl. ............................................. 331/3; 331/94.1
[58] Field of Search ........................................ 331/3, 94.1

[56] References Cited

U.S. PATENT DOCUMENTS

| | | | |
|---|---|---|---|
| 4,331,933 | 5/1982 | Allan et al. ................................. | 331/3 |
| 5,146,184 | 9/1992 | Cutler .......................................... | 331/3 |
| 5,852,386 | 12/1998 | Chantry et al. ......................... | 331/94.1 |

OTHER PUBLICATIONS

"Observation of the Rabi–resonance Spectrum", J.C. Camparo & R.P. Frueholz, Phys. Review A, vol. 38, No. 12, Dec. 15, 1998, pp. 6143–6150.

"Atomic Phase Delay in a Rubidium Atomic Clock", J.C. Camparo & R.P. Frueholz, Proc. 1993 IEEE International Frequency Control Symp.(IEEE Press, NJ, 1993), pp. 114–119.

*Primary Examiner*—Siegfried H. Grimm
*Attorney, Agent, or Firm*—Derrick Michael Reid

[57] ABSTRACT

Frequency stabilization of an atomic system is improved by closed loop stabilization of the power level of an atomic excitation signal. A second harmonic atomic Rabi response varies with excitation power level so that power modulation of the atomic excitation and demodulation of the second harmonic response produces a power error signal for closed loop power level control using a voltage controlled attenuator. The atomic system also includes conventional frequency stabilization closed loop control using a voltage controlled oscillator. Both power and frequency modulation of the excitation signal generate a complete atomic response from which both power and frequency error signals are generated for both power and frequency closed loop stabilization.

12 Claims, 2 Drawing Sheets

2nd Harmonic and Power Error Response

METHOD OF STABILIZING ELECTROMAGNETIC FIELD STRENGTH IN AN ATOMIC SYSTEM

STATEMENT OF GOVERNMENT INTEREST

The invention was made with Government support under Contract No. F04701-93-C-0094 by the Department of the Air Force. The Government has certain rights in the invention. The invention described herein may be manufactured and used by and for the government of the United States for governmental purpose without payment of royalty therefor.

FIELD OF THE INVENTION

The present invention is related to the field of atomic systems and atomic system controls. More particularly, the present invention relates to controlling the amplitude of electromagnetic signals.

BACKGROUND OF THE INVENTION

Precise timekeeping is important in communications and navigation satellite systems. The long-term frequency stability of the atomic standards deployed in those systems can have a significant impact on overall system performance. For example, timekeeping errors that arise in the Milstar system, where atomic clocks are deployed on the satellites and at the ground control stations, will influence system performance during autonomy and endurance periods. Similarly, timekeeping is critical for the Global Positioning System (GPS), where atomic clocks are also deployed on the satellites, because a one microsecond time error can lead to a thousand foot positioning error. Though present atomic clock technology allows these systems to meet their specifications, future systems and system-upgrades will undoubtedly require improvements. Increasing timekeeping precision for small, lightweight satellite clocks would lengthen the autonomy period for Milstar satellites, and would reduce the workload at ground stations conducting satellite time maintenance. Also, the GPS would benefit from improved miniature atomic clocks, because these devices could be incorporated into hand held GPS receivers, thereby increasing the acquisition rate of GPS navigational data. Commercial applications of precise time and frequency are increasing as commercial communications systems seek to more finely divide the radio frequency spectrum for increased traffic.

Rubidium (Rb) atomic clocks are flown on the GPS and Milstar satellites, and are the smallest and lightest atomic clocks presently available. The long term timekeeping behavior of these standards may be limited by variations of microwave power used to excite the Rb atoms of the atomic clock. In a Rb atomic clock, microwave power fluctuations are coupled to the atomic clock output frequency consequently causing a phenomenon known as the position shift effect. In an atomic clock, the output frequency provides a tick rate of the clock. Any changes in the output frequency causes the atomic clock to either run too slow or too fast. For Rb atomic clocks, a single dB change of microwave power can cause the clock to lose or gain a little over two microseconds every day. Navigational missions require timekeeping stability at the nanosecond level and future needs will seek time accuracy at the microsecond level for periods of many weeks.

The signal in a Rb atomic clock is derived from a vapor of atoms contained within a glass resonance cell, and in a process called optical pumping, lamp light or laser light creates an atomic population imbalance among the atomic ground state sublevels amenable to atomic clock signal generation. Examples of atomic systems include those disclosed in U.S. Pat. No. 4,425,653 entitled Atomic Beam Device using Optical Pumping, and U.S. Pat. No. 5,146,184 entitled Atomic Clock System with Improved Servo Systems. U.S. Pat. No. 5,657,340 entitled Rubidium Atomic Clock with Fluorescence Optical Pumping and Method using Same discloses conventional frequency control of an atomic clock system. The resonance cell is situated in a microwave cavity placed inside a solenoid that provides a static magnetic field which isolates the operative atomic resonance from other resonances that would increase the clock's sensitivity to extraneous magnetic fields. Various interactions of the atoms in the vapor cause a slight shift in the clock resonance frequency from what it would be if the atoms were isolated in free space. For example, the magnetic field influences the clock resonance frequency as the quadratic Zeeman shift. The energy of hyperfine energy states with non-zero Zeeman quantum number changes linearly with the static magnetic field strength. The energy of the hyperfine states with zero Zeeman quantum number changes quadratically with the static magnetic field strength. Additionally, the optical pumping light causes a change in the clock resonance frequency as a consequence of a phenomenon termed the AC Stark shift effect.

The clock resonance frequency perturbations are significant to the clock's operation, by altering the tick-rate slightly from what it would be in the absence of those perturbations. To a first approximation, though, the perturbations are not a problem for timekeeping, as the output frequency can be calibrated against a primary reference, such as a cesium atomic clock. Hence, even though the atomic tick-rate is not precise, its offset can be measured and accounted for. However, between periods of calibration, for example during satellite autonomy periods, any change in the perturbations would alter the atomic resonance frequency and would thereby degrade timekeeping.

Microwave power variation in combination with atomic vapor concentration variations can also affect the accuracy of the atomic clock. In the Rb atomic clock, the clock signal is derived from a vapor of atoms contained within a glass resonance cell. Not all regions of the vapor cell are equally illuminated by the microwave power source. In essence, there is a volumetric center region in the vapor gas cell which dominantly affects the clock signal, and which thereby dominantly affects the output frequency. In the gas cell atomic clock, changes in microwave power cause the center region to move. The microwave intensity and static magnetic field strength will be different for the atoms in the center region after it has moved, causing an apparent shift in the resonance frequency, and hence a change in the tick-rate. This particular dependence of the output frequency on microwave power is termed the position shift effect, and is more important to gas cell clock operation than other microwave power perturbations to the output frequency. Using standard methods of microwave power stabilization, there is no direct relationship between the microwave power exciting the atoms in the center region, and that measured by the microwave power detector.

It is desirable to stabilize the microwave power over long periods of time so that the atomic clock has improved accuracy. One straight forward technique, typically used in microwave electronics, is to convert a direct current (DC) microwave power measurement to a voltage, and then to stabilize this measured voltage against a reference voltage. In standard methods of microwave power stabilization, the microwave reference power level is derived from a stable voltage source. However, no reference voltage source presently available has the stability of an atomic clock's output frequency. The disadvantages to this approach are that the DC measurement is subject to low frequency noise and that the reference voltage may drift over time.

In the absence of the field all the atoms are in the ground state. However, as a consequence of interaction with the field some fraction of the atoms will be in the excited state. The degree of atomic excitation is conveniently described in terms of the relative atomic population imbalance Z. The imbalance extends from −1 when all the atoms are in the ground state to +1 when all the atoms are in the excited state, and between −1 and +1 when imbalanced due to excitations. Using a continuous wave field, the imbalance Z is a monotonically increasing function of intensity and asymptotes to a saturation value of zero at the saturation intensity. Moreover, the imbalance Z is a nonlinear function of field frequency.

Typically, when describing field-atom interactions, the strength of the interaction is parametrized by the Rabi frequency W. When an atom is initially in the ground state, and when a strong field is suddenly turned on, the atomic population will exhibit coherent oscillations between the ground and excited states so that the imbalance Z oscillates between +1 and −1. Eventually, the imbalance Z settles down to its equilibrium value of zero with a time constant determined by the two atomic states. This phenomenon is known as Transient Nutation. The oscillations are at the Rabi frequency W, which is proportional to the electromagnetic field-strength. When an atom or molecule is subjected to a frequency modulated resonant field, the resulting population variations show a resonant increase when the Rabi frequency of the excitation is approximately equal to the frequency modulation frequency Fm. Even though the Rabi resonance appears in a quantum system, it is not a typical resonance between atomic energy eigenstates. Rather, it is a dynamical resonance associated with a frequency match between the rate of a perturbation variation, that is the frequency modulation frequency Fm and an atomic internal rate of response to that perturbation at the Rabi frequency.

If the resonant field undergoes frequency modulation at a frequency modulation frequency Fm, the relative atomic population imbalance Z will again undergo an oscillation, this time, however, an undamped oscillation. Temporal variations of the imbalance Z occur at the fundamental modulation frequency and its harmonics because the imbalance Z is a nonlinear function of field frequency. Consequently, the response of the atomic system to the frequency modulated field of the microwave power source may be conveniently expressed in terms of a Fourier expansion.

$$Z(t) = \sum_{K=0}^{\infty} v_k \sin(2\pi K F m t + \theta_K)$$

The amplitude of the second harmonic response ($v_2$) will vary in response to varying intensity of the microwave power. The second harmonic has a high Q response to the Rabi frequency as shown in FIG. 2. The high Q second harmonic response of the atomic imbalance has a maximum when the Rabi frequency is twice the frequency modulated frequency Fm. Prior atomic systems have disadvantageously not stabilized the atomic frequency by not stabilizing the microwave power relying upon the second harmonic response of an atomic system when W=2 Fm. These and other disadvantages are solved or reduced using the invention.

SUMMARY OF THE INVENTION

An object of the invention is to stabilize the excitation of an atomic system.

Another object of the invention is to stabilize the frequency of an atomic system by stabilizing the intensity of microwave power exciting the atomic system.

Yet another object of the invention is to stabilize the frequency of an atomic system by stabilizing the intensity of microwave power excitation using the second harmonic amplitude response of the atomic system.

Still another object of the invention is to stabilize the frequency of an atomic clock using the frequency response of the atomic system and by stabilizing the intensity of microwave power excitation using the second harmonic amplitude response of the atomic system.

The present invention is directed to improved frequency stabilization of an atomic clock by stabilizing the excitation power intensity exciting the atomic system providing an atomic response. An atomic system is excited by an excitation signal. The excitation power intensity level is stabilized by isolating a second harmonic response of the atomic system. The second harmonic response is characterized as a power intensity Rabi resonance having a peak resonance point from which the excitation power is stabilized. The stabilized power intensity functions to improve the frequency stabilization of the atomic clock.

The atomic excitation signal is preferably a frequency modulated signal modulated at modulation frequency Fm. The frequency modulated signal is used for providing conventional frequency stabilization of the atomic clock using conventional frequency stabilization methods. A frequency demodulator generates a frequency error signal by demodulating the atomic response at the modulation frequency Fm. By sensing the frequency error signal, a frequency controller controls a voltage controlled oscillator (VCO) providing a stabilized frequency signal. The frequency error signal varies in DC component with frequency drifts. The frequency error signal is filtered and integrated by the frequency controller. The stabilized frequency signal from the VCO is then power modulated by a power frequency modulation signal Pm and then frequency modulated by the frequency modulation signal Fm providing a frequency modulated signal which is the excitation signal of the atomic system.

The atomic system exhibits excitation power intensity stabilization when the atomic system locks the microwave power to the Rabi frequency W equaling twice the frequency of the frequency modulation signal Fm. The power modulation signal Pm is used to power modulate the stabilized frequency signal of the VCO and to demodulate the second harmonic response for generating a power error signal. The power error signal is then sensed by a power controller controlling a voltage controlled attenuator (VCA) providing a power stabilized signal. The power error signal varies in DC component with power drifts. The power error signal is filtered and integrated by the power controller. The power stabilized signal is also a frequency stabilized signal.

The power and frequency stabilized signal is then power modulated by the power modulation signal Pm and then frequency modulated by the frequency modulation signal Fm for generating the atomic excitation signal which is both power and frequency modulated. The stabilized frequency signal from the VCO is power stabilized using the controlled VCA providing a stabilized power signal stabilized to both frequency and intensity. Hence, the invention provides for the frequency stabilized signal which is used for accurate atomic time keeping by stabilizing both the power and frequency of the atomic excitation signal. The atomic system generates an atomic response used to generate power and frequency error signals in concentric closed loop controls.

The stabilized power and frequency signal from the VCA is power modulated at the power modulation frequency Pm and then frequency modulated at the frequency modulation frequency Fm providing a power modulated and frequency modulated atomic excitation signal. The frequency Fm of the frequency modulation signal is used to set the stabilized power level of the stabilized signal, determines the Rabi frequency W at 2 Fm, and is used to isolate the second harmonic response of the atomic system. The second harmonic response is isolated from the complete atomic response which is an atomic state imbalance response $Z(t)$. The power modulation frequency Pm demodulates the second harmonic response having a maximum at a modulated power level, where W=2 Fm, to provide a minimum power error signal. The Rabi frequency W will vary with the intensity of the atomic excitation signal because the Rabi frequency W is proportional to the field strength of the atomic excitation signal. However, the Rabi frequency locks at 2 Fm as the power level is stabilized. The superimposed power modulation of the excitation is an insignificant second order effect on the Rabi frequency. The power demodulator provides the power error signal for stabilizing the intensity of excitation field strength of the atomic system so that the actual Rabi frequency remains at 2 Fm at the center of the Rabi resonance. The power level locks at the center of the Rabi resonance which depends solely on the frequency modulation frequency Fm used to frequency stabilize the frequency stabilized signal as an accurate clock signal. The frequency modulation frequency Fm in an atomic clock can be derived from the stabilized frequency signal The power and frequency modulated excitation of atoms in the center region of a gas cell functions as a detector of power intensity fluctuation and is used to generate the frequency error signal and the power error signal. The power error signal is sensed and used to control the VCA thereby stabilizing the amplitude of the excitation level. As such, the power level to the atomic system is stabilized to further stabilize the frequency output of the atomic system. This method of excitation field strength stabilization is applicable to a wide class of atomic systems including microwave excited atomic clocks and various laser systems. These and other advantages will become more apparent from the following detailed description of the preferred embodiment.

DETAILED DESCRIPTION OF THE PREFERRED EMBODIMENT

Figure 1:
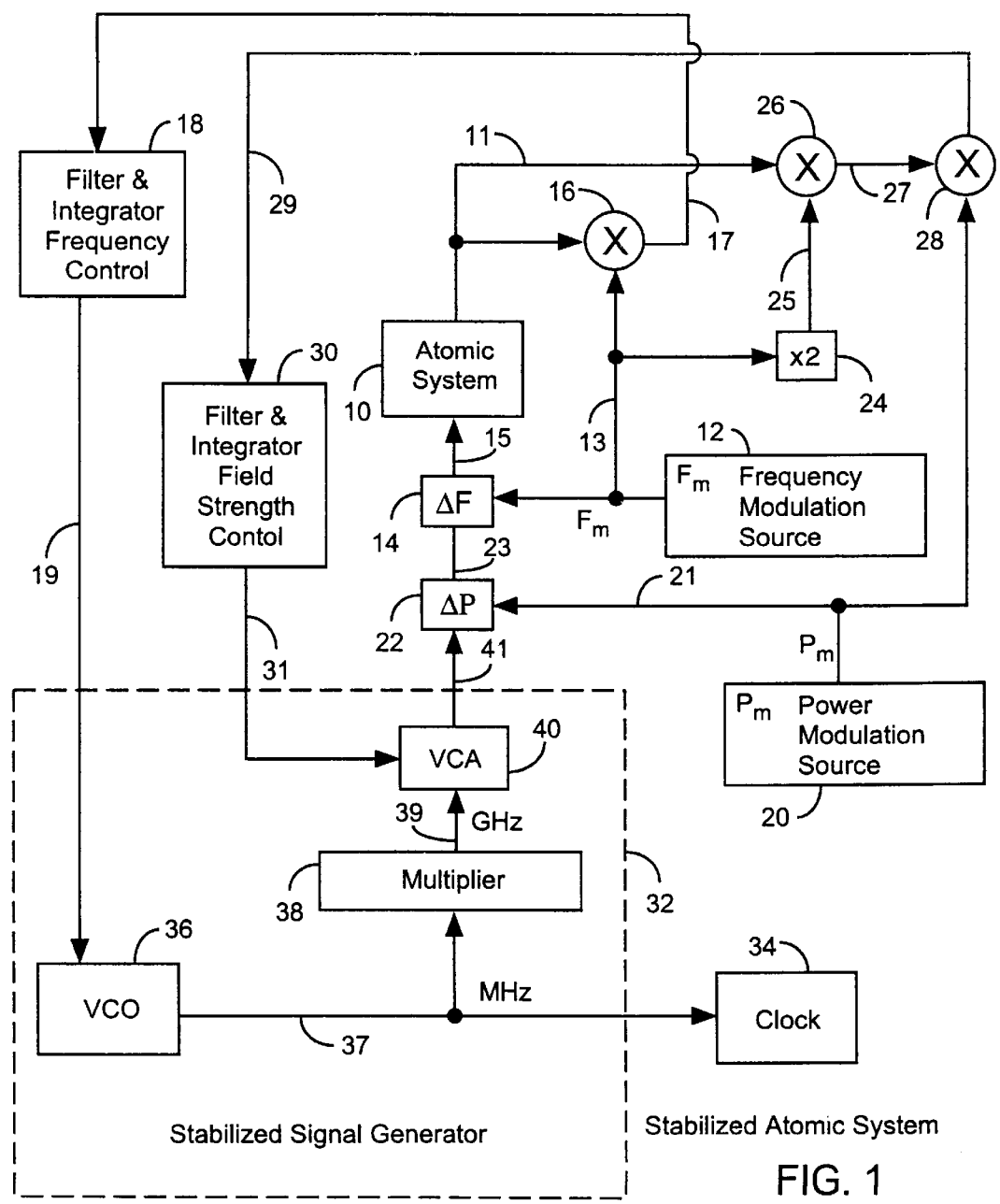
FIG. 1 is a block diagram of a stabilized atomic clock.

An embodiment of the invention is described with reference to the figures using reference designations as shown in the figures. Referring to the Figures, an atomic system 10 provides a complete atomic response signal 11 which is demodulated by a frequency modulation source 12 providing a frequency modulation signal Fm. A frequency modulator 14 is used to modulate the excitation of the atomic system 10 by a frequency modulated signal 15. The frequency modulation signal 13, can be for examples, sine waves or square waves. The atomic response 11 is demodulated by a frequency demodulator 16 providing a frequency error signal 17 communicated to a frequency controller 18 providing a frequency control signal 19 used to stabilize center frequency of the frequency modulated signal 15. As the excitation of the atomic system is modulated at the modulation frequency Fm, the frequency demodulator 16 provides the frequency error signal having a DC component that represents the frequency error. The frequency demodulator 16 produces the frequency error signal 17 that is filtered and integrated by the frequency controller 18 providing the frequency control signal 19 used to stabilize excitation frequency.

Figure 2:
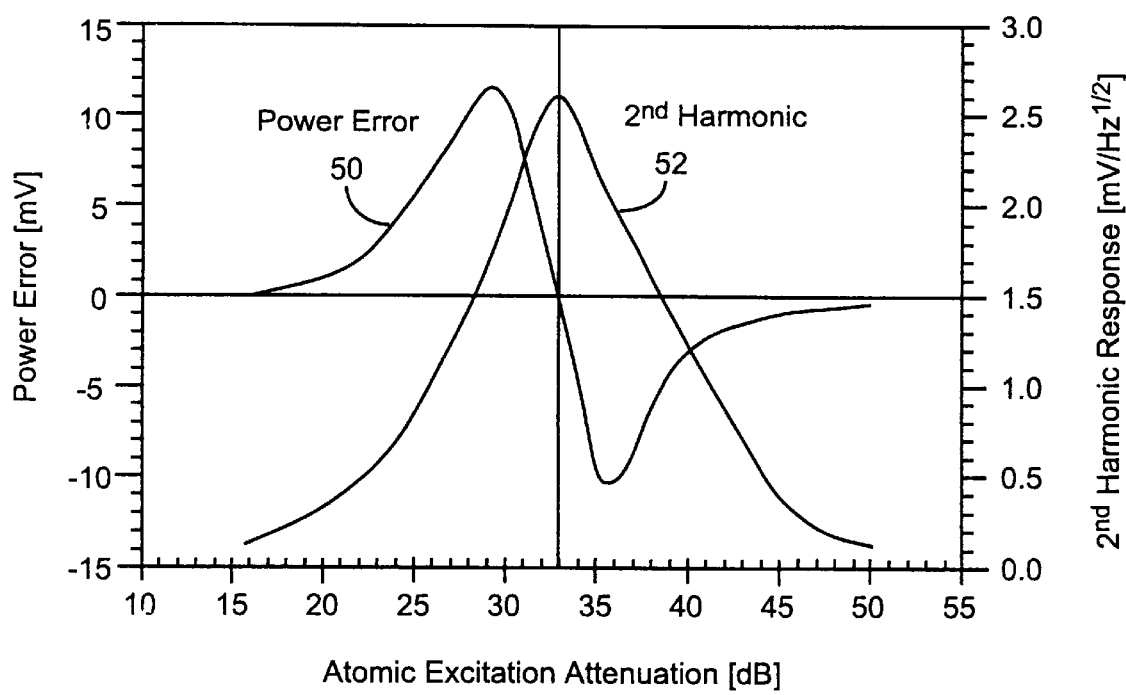
FIG. 2 is a graph depicting a power error signal and the second harmonic response of an atomic system.

The excitation of the atomic system 10 is also power modulated using a Pm power modulation source 20 providing a power modulation frequency signal Pm 21 to a power modulator 22 providing a power modulated signal 23 to the frequency modulator 14. The power modulator 22 provides power modulation at the power modulation frequency Pm. The frequency modulator 14 can be, for example, a commercially available phase modulator which modulates the phase of the power modulated signal 23 which effectively modulates the frequency to provide a frequency modulation signal 15. A times two multiplier 24 doubles the Fm frequency to 2Fm which is equal to the Rabi frequency W. An isolation demodulator 26 is used to demodulate atomic response 11 to isolate the second harmonic response 27 of the atomic system 10. A power demodulator 28 uses the power modulation frequency Pm to generate a power error signal 29. Isolation of the second harmonic response provides the power error signal for excitation power level field-strength stabilization. When the excitation field-strength is stabilized at a specific value, the second harmonic response is maximized and the power error signal is minimized. In order to generate the power error signal, the excitation of the atomic system is power modulated at the power modulation frequency Pm. As the power modulation cycles, a error signal is generated having a DC component that represents the power error. The power demodulator 28 produces the power error signal 29 that is filtered and integrated by the power controller 30. The power error signal 29 communicated to the power controller 30 providing a strength control signal 31 to a stabilized signal generator 32 driving a clock 34. FIG. 2 shows the error signal and the second harmonic response as a function of the excitation power levels. As the excitation is power modulated across the stabilized power level where the second harmonic response has a maximum, the error signal fluctuates across a DC zero value. Any shift in the steady state power level corresponding to the maximum second harmonic response, will cause a DC shift in the error signal.

The generator 32 receives the frequency and power control signals 19 and 31 for exciting the atomic system 10 and for providing the stabilized frequency signal for the clock 34. The frequency control signal 19 controls a voltage controlled oscillator 36 (VCO) providing frequency stabilized signal 37. The frequency stabilized signal 37 is preferably multiplied from the MHz band into the GHz band using multiplier 38 providing a GHz signal 39 communicated to a voltage control attenuator (VCA) 40. The power controller 30 communicates the power control signal 31 to the VCA 40 providing a power stabilized signal 41 to the power modulator 22. The power modulator may be a conventional voltage controlled amplifier.

Conventional frequency control uses the frequency modulator 14, frequency demodulator 16, frequency controller 18 and the VCO 36. The added power control uses the times two multiplier 24, the isolation demodulator 26, the power modulator 22, the power demodulator 28, power controller 30 and the VCA 40. The stabilized signal is typically in the radio frequency (RF) in MHz. The frequency multiplier 38 translates the stabilized MHz signal 37 to a stabilized GHz signal. The stabilized GHz is then attenuated using the VCA providing a stabilized power and frequency signal 41. Thus, the frequency stabilized signal 37 is stabilized by stabilizing both frequency and power. The frequency closed loop control locks the VCO frequency to the resonance between atomic energy states. The power closed loop control locks the power level which determines the Rabi frequency. The atomic stabilization of power is preferably in the microwave band though other frequency bands, such as optical frequency bands could be used. Atomic stabilization of excitation power improves frequency stabilization. The long term frequency stability of this clock is improved, because the power is locked to an atomic Rabi resonance. Furthermore, the atoms that give rise to the signal for frequency stabilization are the same atoms in an inhomogeneous sample that give rise to the signal for power stabilization.

The atomic system 10 may be an optically pumped vapor atomic system of Rb87 atoms responding to the modulated excitation electromagnetic fields. The atomic system 10 produces the atomic response 11 at the fundamental modulation frequency Fm and its second harmonic detected by isolator 26 for producing the power error signal 29. The frequency Fm is selected and used to lock the frequency of the excitation signal 15 to the resonance between atomic energy states. The construction of a microwave cavity and the resonance cell of an atomic system 10 are well understood by the atomic clock designers.

A microwave excitation resonant with the ground state hyperfine transition of Rb87 is frequency modulated, and the resulting Rabi resonance is observed as the second harmonic response to the frequency modulated excitation. Using standard heterodyne demodulation, the change in the second harmonic response with microwave field-strength variation generates the power error signal for field-strength stabilization. In an open loop test configuration, a slow peak-to-peak drift of sinusoidal power variation of the excitation can be observed in the error signal.

The atomic system 10 may be a conventional design having many components, not shown, but well understood by those skilled in the art of atomic system design. The atomic system 10 may comprise a Corning 7070 glass resonance cell containing isotopically pure Rb87 and ten torr of nitrogen gas placed in a microwave cavity whose TE011 mode is resonant with the (F=2, mF=0) to (F=1, mF=0) ground state 0—0 hyperfine transition of Rb87 at 6834.7 MHz. The cylindrical microwave cavity may have a radius of 2.8 cm and a length of 5.0 cm, and the resonance cell may fill the cavity volume. Braided windings wrapped around the cavity may heat the resonance cell to approximately 40° C., and the entire assembly can be located in a solenoid providing a magnetic field of about 300 mG parallel to the cylindrical axis of the microwave cavity. Light from an AlGaAs diode laser at about 3.0 mW may be tuned to the Rb87 $5^2P_{1/2}F=1$ to $5^2S_{1/2}(F=2)$ transition. The atomic system 10 has appropriate excitation attenuation, such as a 2.0 optical density filter, before passing the light through the resonance cell. The transmission of the laser light through the vapor may be monitored and detected by a silicon photodiode, and the propagation direction of the laser may be parallel to the cavity axis. In the absence of resonant microwaves, optical pumping will reduce the density of atoms in the F=2 absorbing state, and consequently increase the amount of light transmitted through the vapor. However, when the microwave frequency is resonant with the Rb87 0—0 hyperfine transition atoms will return to the $5_2S^{1/2}$(F=2) state from the $5_2S^{1/2}$(F=1) state, the amount of transmitted and detected light is reduced. The transmitted laser light therefore acts as a measure of the atomic population in the F=2 manifold of Zeeman sublevels. Specifically, any microwave excitation field induced oscillation of the atomic population is observed as oscillations in the transmitted light intensity.

The excitation is derived from the VCO which may be a voltage-controlled-crystal-oscillator having a modulation bandwidth of ten kilohertz with a stabilized signal of 107 MHz which is multiplied up to the 6.8347 GHz by the frequency multiplier 38 which multiplies the frequency of the stabilized signal 37 by fixed value, for example, sixty four. The multiplied signal 39 is attenuated by the combination of the voltage-controlled-attenuator (VCA) and any fixed attenuators, not shown, for proper scaling of the excitation power level using, for example, solid state amplifiers, not shown. The setting of VCA 40 can be calibrated in terms of Rabi frequency by measuring the 0—0 hyperfine transition line width.

The frequency modulation source 12 may be a sine wave generator or frequency synthesizer providing the frequency modulation signal Fm at, for example, 357.34 Hz. This sets the second harmonic and hence the Rabi frequency to 714.68 Hz. The excitation field-strength, and the excitation power is power modulated by applying a sinusoidal power modulation signal Pm to a voltage control amplifier 22. The power modulation frequency Pm is set to a low arbitrary frequency, for example, 47.34 Hz, but should be different from Fm. The power error signal 29 has a frequency of twice Pm at 96.68 Hz with a DC error component. The atomic system response 11 includes a 47.34 Hz component derived from the power modulation frequency Pm, includes a 357.34 Hz component from the frequency modulation frequency Fm, and a 714.68 Hz 2nd harmonic response also due to the Rabi resonance responding to the power modulation.

In order to test the efficacy of this atomic stabilization method, a slowly varying drift voltage can added to the VCA control signal 31 to inject a drift in the excitation intensity. With power feedback control loop closed, any changes in the added drift voltage signal, results in an increased power error signal which cancels out the added drift voltage signal to thereby stabilize the excitation power.

The Rabi resonance method can be applied to atomic clocks, where microwave excitation power variations are known to give rise to atomic clock frequency variations. In such an application, the first harmonic response to a frequency modulated excitation is used to stabilize the frequency as is presently done in atomic clocks, while the second harmonic response is used to stabilize power level. In the case of the gas-cell atomic clock, where different atoms in a vapor contribute to the clock signal to varying degrees, the Rabi resonance method may use those atoms dominating the frequency stabilization signal that also dominate the field-strength stabilization signal.

The center of the Rabi resonance depends on the frequency Fm of the frequency modulation signal. A change in the frequency Fm changes the operating position of the Rabi resonance. Consequently, in this atomic stabilization technique, the power level stability can only be as good as the stability of the frequency modulation frequency Fm. However, this is not a severe limitation of the Rabi resonance method. Not only is the output frequency of a generator typically quite stable, but the synthesizer can be referenced to an external atomic frequency standard. Hence, the center position of the Rabi resonance has the potential to be as stable as the output of an atomic clock. The Pm and Fm generators 20 and 12 can have inherently stabilized modulation frequencies.

Rabi resonances have been observed in the optical band. The atomic stabilization of field-strength can be applied to optical systems such as in stabilizing laser intensity. An electrooptic modulator could be used as a voltage-controlled-attenuator VCA to stabilize laser intensity. Moreover, depending on the frequency modulation waveform, it is possible to generate a spectrum of Rabi resonances one of which could be used to provide for laser intensity or atomic power stabilization. Those skilled in the art can make enhancements, improvements and modifications to enhance the invention. However, those enhancements, improvements and modifications may nonetheless fall within the spirit and scope of the following claims.

What is claimed is:

1. A method for stabilizing the excitation of an atomic system having a second harmonic response varying with intensity of the excitation of the atomic system, the method comprising the steps of, modulating at a Pm frequency the power level of the excitation of the atomic system, isolating the second harmonic response from the atomic system, generating a power error signal from the second harmonic response, the error signal is at a null when the power level of excitation is stabilized, and adjusting the power level of the excitation to null the error signal to stabilize the power level of the excitation.

2. The method of claim 1, wherein the modulating step comprises the step of, generating a power modulation signal having a frequency of Pm.

3. The method of claim 1, wherein in the generating step, the error signal is generated by demodulating the second harmonic response at the Pm frequency.

4. A method for stabilizing the excitation of an atomic system having an atomic response comprising a first harmonic response varying with frequency of the excitation of the atomic system and a second harmonic response varying with intensity of the excitation of the atomic system, the method comprising the steps of, generating a power modulation signal having a frequency of Pm, power modulating the intensity of the excitation by the frequency Pm, generating a frequency modulation signal having a frequency of Fm, frequency modulating the frequency of the excitation by the frequency Fm, frequency demodulating the atomic response by the frequency Fm to provide a frequency error signal from the first harmonic response, the frequency error signal is at a null when the frequency of the excitation is stabilized, isolating the second harmonic response from the atomic response, frequency demodulating the second harmonic response by the frequency Pm to provide a power error signal that is at a null when the intensity of excitation is stabilized, frequency controlling the frequency of the excitation to be stabilized when the frequency error signal is null, and power controlling the intensity of the excitation to stabilize the excitation when the power error signal is null.

5. The method of claim 4, wherein the frequency controlling step comprises the steps of, filtering and integrating the frequency error signal providing a frequency control signal, and controlling a voltage controlled oscillator by the frequency control signal to generate the excitation at a stabilized frequency.

6. The method of claim 4, wherein the power controlling step comprises the steps of, filtering and integrating the power error signal providing a power control signal, and controlling a voltage controlled attenuator by the power control signal to generate the excitation at stabilized intensity.

7. The method of claim 4 wherein the frequency controlling and power controlling steps comprise the steps of, filtering and integrating the frequency error signal providing a frequency control signal, filtering and integrating the power error signal providing a power control signal, controlling a voltage controlled oscillator by the frequency control signal to generate a frequency stabilized signal, and controlling a voltage controlled attenuator by the power control signal to generate a power stabilized signal, the power stabilized signal is then power modulated and frequency modulated providing the excitation to the atomic system.

8. The method of claim 4 wherein the frequency controlling and power controlling steps comprise the steps of, filtering and integrating the frequency error signal providing a frequency control signal, filtering and integrating the power error signal providing a power control signal, controlling a voltage controlled oscillator by the frequency control signal to generate a frequency stabilized signal in the mega hertz band, multiplying the frequency stabilized signal up to the giga hertz band, and controlling a voltage controlled attenuator by the power control signal to generate a power stabilized signal, the power stabilized signal is then power modulated and frequency modulated providing the excitation to the atomic system.

9. The method of claim 4, the atomic system using atomic specie having a hyperfine atomic transition corresponding to 6.8347 giga hertz, wherein the frequency and power controlling steps comprise the steps of, filtering and integrating the frequency error signal providing a frequency control signal, filtering and integrating the power error signal providing a power control signal, controlling a voltage controlled oscillator by the frequency control signal to generate a frequency stabilized signal at 107 MHz mega hertz band, multiplying the frequency stabilized signal by sixty four to 6.8347 giga hertz, and controlling a voltage controlled attenuator by the power control signal to generate a power stabilized signal, the power stabilized signal is then power modulated and frequency modulated providing the excitation to the atomic system.

10. The method of claim 9 wherein, the frequency Fm is 357.34 hertz, and the frequency Pm is less than Fm.

11. A method for stabilizing a frequency stabilized signal of an atomic system having an atomic response comprising a first harmonic response varying with frequency of the excitation of the atomic system and a second harmonic response varying with intensity of an excitation of the atomic system, the method comprising the steps of, generating a power modulation signal having a frequency of Pm, power modulating the intensity of the excitation by the frequency Pm, generating a frequency modulation signal having a frequency of Fm, frequency modulating the frequency of the excitation by the frequency Fm to generate a frequency modulated signal that is the excitation of the atomic system, frequency demodulating the atomic response by the frequency Fm to provide a frequency error signal from the first harmonic response, the frequency error signal is at a null when the frequency of the excitation is stabilized, isolating the second harmonic response from the atomic response, power demodulating the second harmonic response by the frequency Pm to provide a power error signal that is at a null when the intensity of excitation is stabilized, filtering and integrating the frequency error signal providing a frequency control signal, filtering and integrating the power error signal providing a power control signal, controlling a voltage controlled oscillator by the frequency control signal to generate the frequency stabilized signal in the mega hertz band, multiplying the frequency stabilized signal up to the giga hertz band to provide a multiplied signal, and controlling a voltage controlled attenuator by the power control signal to generate a power stabilized signal from the multiplied signal, the power stabilized signal is then power modulated and frequency modulated providing the excitation to the atomic system.

12. The method of claim 11 wherein the frequency Fm is 357 hertz, the frequency Pm is 47 hertz, the frequency of the frequency stabilized signal is 107 mega hertz, the frequency of the multiplied signal is 6.834 giga hertz, and the atomic system includes rubidium atoms having a hyperfine transition corresponding to 6.834 giga hertz.

* * * * *